United States Patent
Fang

(10) Patent No.: US 9,350,587 B1
(45) Date of Patent: May 24, 2016

(54) SYSTEM AND METHOD FOR TIMING ERROR ESTIMATION

(71) Applicant: MARVELL INTERNATIONAL LTD., Hamilton (BM)

(72) Inventor: Jing Fang, San Jose, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 1 day.

(21) Appl. No.: 14/092,307

(22) Filed: Nov. 27, 2013

Related U.S. Application Data

(60) Provisional application No. 61/731,991, filed on Nov. 30, 2012.

(51) Int. Cl.
| | |
|---|---|
| *H04L 27/28* | (2006.01) |
| *H04L 27/26* | (2006.01) |
| *H03L 7/093* | (2006.01) |
| *H04L 27/06* | (2006.01) |
| *H04L 7/033* | (2006.01) |

(52) U.S. Cl.
CPC ............ *H04L 27/2655* (2013.01); *H03L 7/093* (2013.01); *H04L 7/0331* (2013.01); *H04L 27/066* (2013.01)

(58) Field of Classification Search
CPC ...... H04L 7/0331; H04L 27/066; H03L 7/093
USPC .................. 375/260, 371, 373; 327/141, 156; 358/409; 370/503; 713/400; 714/12
See application file for complete search history.

(56) References Cited

U.S. PATENT DOCUMENTS

| | | |
|---|---|---|
| 5,694,389 A | 12/1997 | Seki et al. |
| 6,215,819 B1 | 4/2001 | Hyakudai et al. |
| 6,219,334 B1 | 4/2001 | Sato et al. |
| 6,947,475 B2 | 9/2005 | Sendonaris et al. |
| 7,308,034 B2 | 12/2007 | Jeon et al. |

(Continued)

FOREIGN PATENT DOCUMENTS

| | | |
|---|---|---|
| WO | WO-2007/083902 A1 | 7/2007 |
| WO | WO-2013/070651 A1 | 5/2013 |

OTHER PUBLICATIONS

IEEE Std 802.11™ 2012 (Revision of IEEE Std 802.11-2007) IEEE Standard for Information technology—Telecommunications and information exchange between systems—Local and metropolitan area networks—Specific requirements Part 11: Wireless LAN Medium Access Control (MAC) and Physical Layer (PHY) specifications, *The Institute of Electrical and Electronics Engineers, Inc.*, pp. 1-2695 (Mar. 29, 2012).

(Continued)

*Primary Examiner* — Leila Malek

(57) ABSTRACT

A method of performing timing recovery in a receiver device includes receiving an oversampled signal corresponding to at least a first portion of a radio frequency signal received by the receiver device from a transmitter device. The oversampled signal is sampled at an oversampling rate that is higher than a baud rate of the receiver device. The method also includes estimating a first timing error using samples of the oversampled signal. Estimating the first timing error includes generating a first timing error signal indicative of the estimated first timing error. The method also includes adjusting, using the first timing error signal, at least one sampling rate at which received signals are sampled in the receiver device.

9 Claims, 8 Drawing Sheets

(56) References Cited

U.S. PATENT DOCUMENTS

| | | | |
|---|---|---|---|
| 7,440,506 | B2 | 10/2008 | Atungsiri et al. |
| 7,627,049 | B2 | 12/2009 | Kim |
| 7,701,917 | B2 | 4/2010 | Mantravadi et al. |
| 7,764,753 | B2 | 7/2010 | Cheng et al. |
| 7,940,849 | B1 | 5/2011 | Fang et al. |
| 7,970,070 | B2 | 6/2011 | Yousef et al. |
| 7,995,688 | B2 | 8/2011 | Hong et al. |
| 8,059,627 | B2 | 11/2011 | Hong et al. |
| 8,238,482 | B2 | 8/2012 | Chen et al. |
| 8,249,180 | B2 | 8/2012 | Kawauchi et al. |
| 8,306,148 | B2 | 11/2012 | Rajagopal |
| 8,406,322 | B2 | 3/2013 | Okamoto et al. |
| 8,520,781 | B2 | 8/2013 | Weng et al. |
| 8,625,656 | B2 | 1/2014 | Luo et al. |
| 8,660,200 | B2 | 2/2014 | Patel et al. |
| 8,675,749 | B2 | 3/2014 | Khoshgard et al. |
| 8,750,089 | B2 | 6/2014 | Ariyavisitakul et al. |
| 8,903,001 | B2 | 12/2014 | Fang et al. |
| 2003/0128660 | A1 | 7/2003 | Ito et al. |
| 2005/0163094 | A1 | 7/2005 | Okada et al. |
| 2006/0285599 | A1 | 12/2006 | Seki et al. |
| 2008/0032630 | A1 | 2/2008 | Kim et al. |
| 2009/0011722 | A1* | 1/2009 | Kleider et al. ............. 455/101 |
| 2009/0296862 | A1 | 12/2009 | Nakaya |
| 2010/0014614 | A1* | 1/2010 | Leach et al. ............. 375/340 |

OTHER PUBLICATIONS

IEEE Std 802.11ac/D4.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-408 (Oct. 2012).

IEEE Std 802.11ac/D5.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-440 (Jan. 2013).

IEEE Std 802.11ac/D6.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-446 (Jul. 2013).

IEEE Std 802.11ac/D7.0 "Draft Standard for Information Technology—Telecommunications and information exchange between systems—Local and metropolitan area networks—Specific requirements, Part 11: Wireless LAN Medium Access Control (MAC) and Physical Layer (PHY) specifications: Amendment 4: Enhancements for Very High Throughput for Operation in Bands below 6 GHz," *The Institute of Electrical and Electronics Engineers, Inc.*, pp. 1-456 (Sep. 2013).

IEEE Std 802.16-2009 (Revision of IEEE Std. 802.16-2004), IEEE Standard for Local and metropolitan area networks: Part 16: Air Interface for Broadband Wireless Access Systems, *The Institute of Electrical and Electronics Engineers, Inc.*, 2082 pages (May 29, 2009).

IEEE 802.20-PD-06; IEEE P 802.20TMV14, Draft 802.20 Permanent Document; <System Requirements for IEEE 802.20 Mobile Broadband Wireless Access Systems—Version 14>, 24 pages (Jul. 16, 2004).

Fang, Jing, "Method and Apparatus for Joint Estimation of Carrier Frequency Offset and Sampling Frequency Offset," U.S. Appl. No. 13/898,156, filed May 20, 2013 (24 pages).

Funada, et al., "A Challe Estimation Method for a Highly Mobile OFDM Wireless Access System," IEICE Transactions on Communications, vol. E88-B, No. 1 pp. 282-291 (Jan. 2005).

\* cited by examiner

SYSTEM AND METHOD FOR TIMING ERROR ESTIMATION

CROSS-REFERENCES TO RELATED APPLICATIONS

This claims the benefit of U.S. Provisional Patent Application No. 61/731,991, entitled "Timing Offset (Sampling Frequency) Estimation for DVB Receiver" and filed on Nov. 30, 2012, the disclosure of which is hereby incorporated herein by reference.

FIELD OF THE DISCLOSURE

The present disclosure relates generally to wireless communication devices and, more particularly, to techniques for estimating timing error at a receiver.

BACKGROUND

In Digital Video Broadcasting (DVB) systems, such as systems operating according to the DVB-T (Digital Video Broadcasting—Terrestrial) standard, the DVB-T2 (Digital Video Broadcasting—Second Generation Terrestrial) standard, or the DVB-C2 (Digital Video Broadcasting—Second Generation Cable) standard, robust demodulation generally requires that the sampling rate at the receiver be well-matched to the sampling rate at the transmitter. To reduce the number of errors (e.g., bit errors, symbol errors, etc.) at the receiver, techniques have been developed to estimate the timing error/offset between transmitter and receiver sampling frequencies, and to adjust/correct the timing of the received signal based on the estimated timing error. Conventional techniques for timing error estimation attempt to minimize hardware requirements by estimating timing error based on the received signal after the received signal has been downsampled to the baud rate, which allows correlators of the timing error estimator to operate on a relatively small sample set. While these conventional techniques can reduce the amount of hardware needed in the receiver, they generally suffer from long convergence times and/or low accuracy in acquisition.

SUMMARY

In an embodiment, a method of performing timing recovery in a receiver device includes receiving, in the receiver device, an oversampled signal corresponding to at least a first portion of a radio frequency signal received by the receiver device from a transmitter device. The oversampled signal is sampled at an oversampling rate that is higher than a baud rate of the receiver device. The method also includes estimating, in the receiver device, a first timing error using samples of the oversampled signal. Estimating the first timing error includes generating a first timing error signal indicative of the estimated first timing error. The method also includes adjusting, in the receiver device and using the first timing error signal, at least one sampling rate at which received signals are sampled in the receiver device.

In another embodiment, an apparatus includes a first timing error estimator configured to receive an oversampled signal corresponding to at least a first portion of a radio frequency signal received by a receiver device from a transmitter device. The oversampled signal is sampled at an oversampling rate that is higher than a baud rate of the receiver device. The first timing error estimator is also configured to estimate a first timing error using samples of the oversampled signal. The first timing error estimator is configured to estimate the first timing error at least by generating a first timing error signal indicative of the estimated first timing error. The apparatus also includes a timing recovery unit that is coupled to an output of the first timing error estimator, and configured to adjust, using the first timing error signal, at least one sampling rate at which received signals are sampled in the receiver device.

In another embodiment, a method of performing timing recovery in a receiver device includes receiving, in the receiver device, an oversampled signal corresponding to a radio frequency signal received by the receiver device from a transmitter device. The oversampled signal is sampled at an oversampling rate that is higher than a baud rate of the receiver device. The method also includes determining, in the receiver device, an actual number of samples in the oversampled signal. Determining the actual number includes generating a first output indicative of the actual number. The method also includes determining, in the receiver device, an expected number of samples in the oversampled signal. Determining the expected number includes generating a second output indicative of the expected number. The method also includes generating, in the receiver device and using (i) the first output and (ii) the second output, a timing error signal indicative of a timing error associated with the oversampled signal, and adjusting, in the receiver device and using the timing error signal, at least one sampling rate at which received signals are sampled in the receiver device.

In another embodiment, an apparatus includes a timing error estimator configured to receive an oversampled signal corresponding to a radio frequency signal received by a receiver device from a transmitter device. The oversampled signal is sampled at an oversampling rate that is higher than a baud rate of the receiver device. The timing error estimator includes a first counter configured to determine an actual number of samples in the oversampled signal at least by generating a first counter output, a second counter configured to determine an expected number of samples in the oversampled signal at least by generating a second counter output, and an operator unit configured to generate, using (i) the first counter output and (ii) the second counter output, a timing error signal indicative of a timing error associated with the oversampled signal. The apparatus also includes a timing recovery unit that is coupled to an output of the operator unit, and configured to adjust, using the timing error signal, at least one sampling rate at which received signals are sampled in the receiver device.

DETAILED DESCRIPTION

In various embodiments described below, timing error/offset of a sampling rate in a receiver is estimated by operating on received signals before downsampling the signals to the baud rate. In particular, in an embodiment, a receiver (e.g., a Digital Video Broadcasting (DVB) receiver) performs correlations on received orthogonal frequency division multiplexing (OFDM) signals before the received signals have been downsampled to the baud rate (or after baud rate signals have been upsampled), thereby allowing the timing error to be estimated with greater resolution/accuracy, and with quicker convergence. In some embodiments, the timing error estimation is performed, at least initially, by hardware (e.g., multipliers, memory, etc.) that is typically dedicated to post-processing of the received signal. At a later time (e.g., after one, two or several OFDM symbols have been received), when the post-processing hardware is needed for it usual function of post-processing received signals, other techniques are used to track the timing error, in an embodiment.

Figure 1:
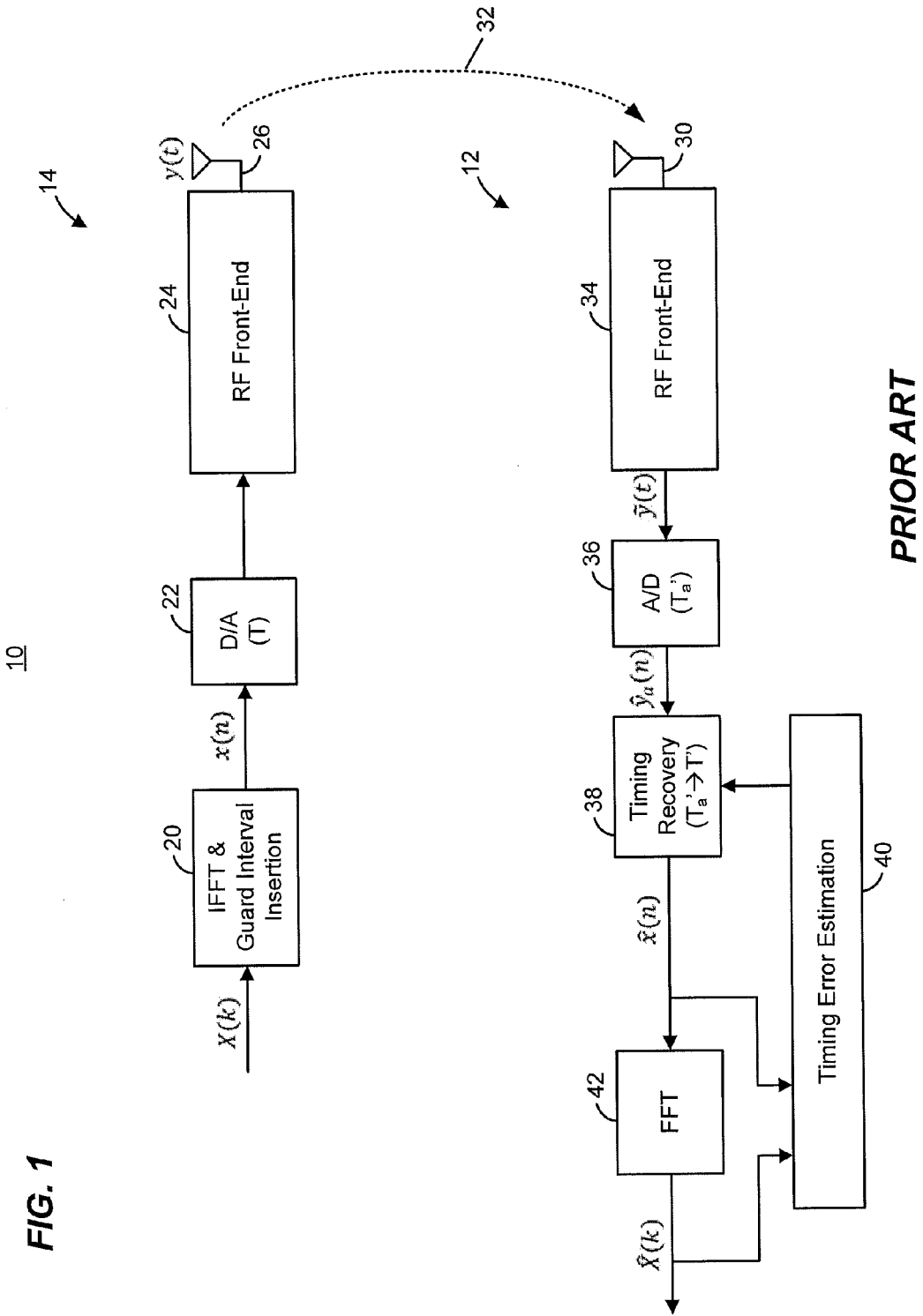
FIG. 1 is a block diagram of a DVB communication system that implements conventional timing error estimation techniques.

FIG. 1 is a block diagram of a conventional DVB system 10, such as a system operating according to the DVB-T (Digital Video Broadcasting—Terrestrial) or DVB-T2 (Digital Video Broadcasting—Second Generation Terrestrial) standard, that utilizes OFDM communications. In OFDM, each of a plurality of orthogonal sub-carriers is modulated with a modulation scheme, such as quadrature amplitude modulation (QAM), phase shift keying (PSK), etc., at a relatively low symbol rate. Even though data on a particular sub-carrier is modulated at a low symbol rate, the large total number of sub-carriers provides an overall data rate that is similar to single-carrier modulation schemes utilizing the same bandwidth. An advantage of OFDM over single-carrier modulation schemes is the ability to cope with severe channel conditions, such as multipath and narrowband interference. For instance, the relatively low symbol rate allows the use of a guard interval between symbols to help manage time-domain spreading of the signal due to multipath propagation. Some OFDM systems utilize pilot signals in one or more sub-channels for purposes such as synchronization and channel estimation.

The conventional DVB system 10 includes a receiver device 12, and a transmitter device 14 that transmits OFDM signals to the receiver device 14. For clarity, FIG. 1 shows only portions of the receiver device 12 and transmitter device 14. In the transmitter 14, the input X(k) represents a number of parallel inputs each carrying QAM-modulated symbols. The input X(k) is provided to an inverse fast Fourier transform (IFFT) and guard interval insertion (GI insertion) unit 20. The IFFT and GI insertion unit 20 performs an IFFT operation on X(k) to generate OFDM symbols, and inserts a guard interval before each OFDM symbol. The guard interval may include a cyclic prefix, which is merely a copy of an ending portion of the OFDM symbol following the guard interval.

A digital-to-analog converter (D/A) 22 is coupled to the IFFT and GI insertion unit 20, and converts the samples x(n) output by the IFFT and GI insertion unit 20 to an analog signal. The sampling period corresponding to the D/A 22 is denoted as T. A radio frequency (RF) front-end 24 is coupled to the D/A 22 and up-converts the output of the D/A 22 by modulating a carrier frequency to generate a signal y(t), which is transmitted to the receiver device 12 via an antenna 26 and wireless channel 32.

At the receiver device 12, a modified version of the signal y(t) is received via an antenna 30. For example, the signal y(t) may be modified due to multipath interference, additive noise, etc. The receiver device 12 includes an RF front-end 34, coupled to the antenna 30, which down-converts the received signal to baseband. The RF front-end 34 may further modify the signal y(t) (e.g., due to phase and/or amplitude imbalances in the RF front-end 34), and provides the down-converted (baseband) signal $\tilde{y}(t)$ to an analog-to-digital converter (A/D) 36.

The A/D 36 samples the baseband signal $\tilde{y}(t)$ at a sampling period of $T_a'$ in order to generate a digital signal $\hat{y}_a(n)$. As used herein, the subscript a is used to denote a signal sampled at the oversampling rate R, and to denote parameters that are scaled in a manner corresponding to the oversampling rate (as will be seen in Equation 6 below). A timing recovery unit 38 is coupled to the output of the A/D 36. The timing recovery unit 38 typically performs timing correction and resampling (often downsampling) of the signal $\hat{y}_a(n)$ in order to output a digital signal $\hat{x}(n)$ at the baud rate with sampling period T'. Ideally, the sampling period T' is exactly the same as the sampling period T of D/A 22 in the transmitter device 14. In reality, however, the sampling period T' is slightly different than T, resulting in a sampling period timing error/offset, $\Delta T = T' - T$. A timing error estimation unit 40 generates estimates of the sampling period timing error $\Delta T$, which are provided to the timing recovery unit 38 to improve future timing recovery.

A fast Fourier transform (FFT) unit 42 is coupled to the output of timing recovery unit 38, and performs an FFT operation on a set of samples (of the signal $\hat{x}(n)$) that corresponds to an OFDM symbol and, optionally, on the cyclic prefix of the OFDM symbol. The FFT unit 42 generates a set of parallel signals, $\hat{X}(k)$, that corresponds to the set of parallel signals X(k) generated at the transmitter device 14.

The timing error estimation unit 40 estimates the timing error $\Delta T$, in some conventional DVB systems such as DVB system 10, by using a combination of two different estimation techniques. The first estimation technique, known as "integer timing error estimation," correlates samples, sampled at the baud rate, in the guard interval of received OFDM symbols. Because each OFDM symbol is preceded by a cyclic prefix that is the same as the end of the OFDM symbol, an autocorrelation function provides peaks that ideally correspond to the start and end of each OFDM symbol. The correlation function is calculated as $$C(m) = \frac{1}{N}\sum_{n=1}^{N} \hat{x}(n)\hat{x}^*(n+F+m),$$ Equation 1 where F is the FFT size used by FFT unit 42, n is the sample index in the OFDM symbol guard interval, N is the total number of samples used for the correlation, and m is the sample offset, and where $-M \leq m \leq M$ with M being the maximum sample offset. The constant $1/N$ may be omitted, because (as seen below) the goal is to find a maximum value. The estimated integer timing error at the baud rate ($\Delta T_I$) can then be calculated as $$\Delta T_I = \frac{-mm}{F + mm} T, \qquad \text{Equation 2}$$

where T is the elementary time period corresponding to D/A 22 in FIG. 1, and where mm is the value of m for which C(m) is maximized, such that $$C(mm) = \max(C(m)) \qquad \text{Equation 3}$$

Because the correlations C(m) are performed on a relatively low sampling rate (i.e., baud rate) signal, however, the estimated integer timing error $\Delta T_I$ suffers from low accuracy. To achieve greater accuracy, the second estimation technique, known as "fractional timing error estimation," is used in conjunction with the integer timing error estimation. Fractional timing error estimation operates on the received signal after the baud rate signal has been converted to the frequency domain using FFT unit 42, and typically operates by averaging the phase difference between pilots of successive OFDM symbols. The fractional timing error ($\Delta T_F$) can be calculated as $$\Delta T_F = \frac{1}{K} \sum_{k=k_1}^{k_K} \Delta T_k, \qquad \text{Equation 4}$$

where k is the pilot index in frequency and K is the total number of pilots used for the estimation. $\Delta T_k$ can be calculated as $$\Delta T_k = T' - T = \frac{\phi_{k,s+1} - \phi_{k,s}}{2\pi k(F + G)} FT, \qquad \text{Equation 5}$$

where G is the size of the OFDM symbol guard interval, $\phi_{k,s}$ is the phase of the k-th pilot of the s-th OFDM symbol to which the pilot phase $\phi_{k,s}$ corresponds, and $\phi_{k,s+1}$ s the phase of the same pilot but in the next, (s+1)-th OFDM symbol.

While the fractional timing error estimation technique helps to improve the accuracy of timing recovery at the receiver, the convergence time for the combined integer timing error estimation and fractional timing error estimation can be relatively large. In some circumstances, the large convergence time can render a portion of the received data useless, such as when a DVB-T2 signal is received and the timing error is too large to successfully demodulate and decode earlier frames after detection.

Figure 2:
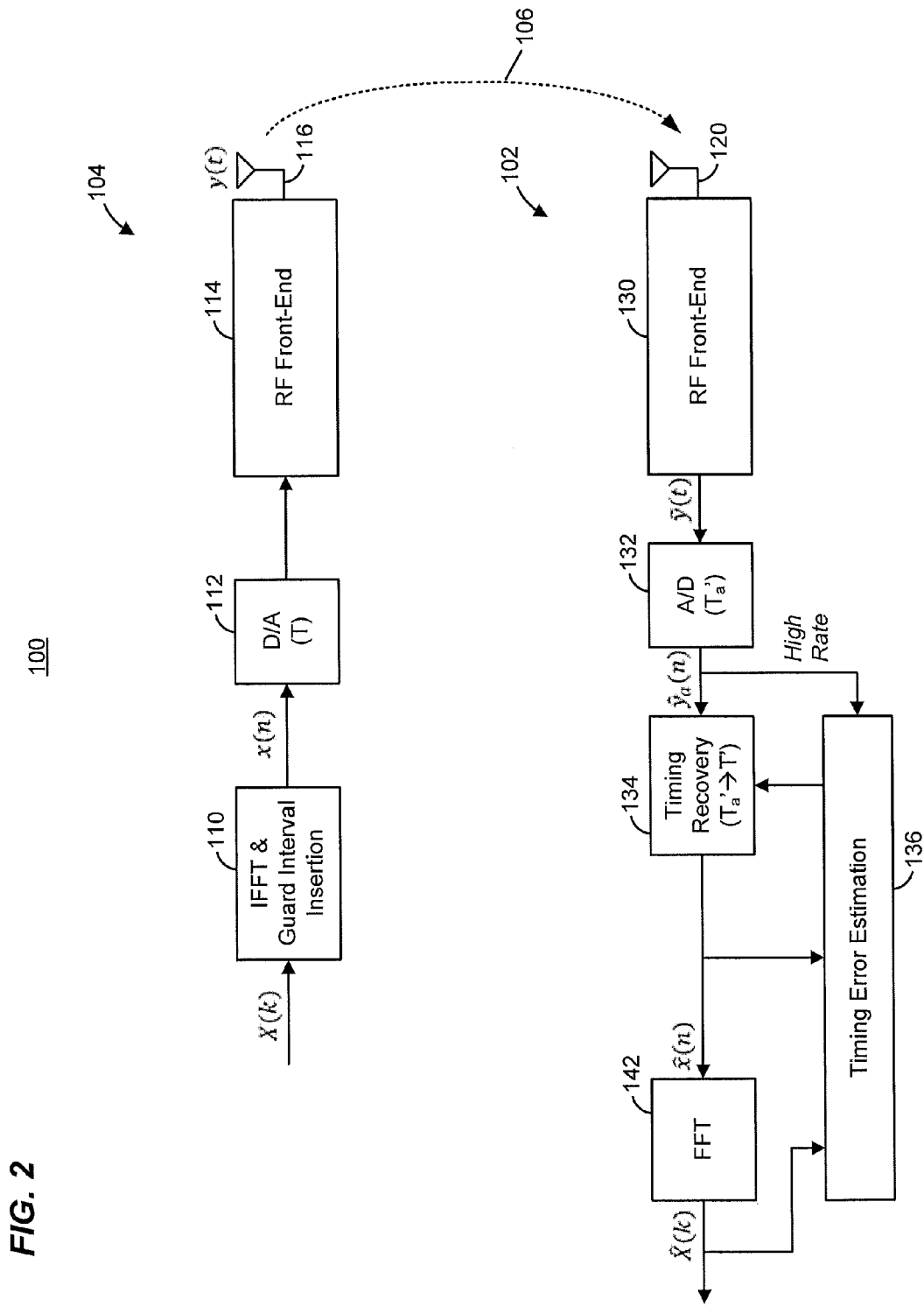
FIG. 2 is a block diagram of an example DVB communication system that includes a receiver device implementing modified timing error estimation techniques described herein, according to an embodiment.

In various embodiments described below, integer timing error estimation is instead, or additionally, performed at an oversampling rate (i.e., higher than the baud rate) in order to achieve better accuracy and/or lower convergence times. FIG. 2 is a block diagram of an example communication system 100 that includes a receiver device 102 implementing one such modified timing error estimation technique, according to an embodiment. The receiver device 102 receives OFDM signals from a transmitter device 104 via a wireless channel 106. Similar to FIG. 1, only a portion of the receiver device 102, and only a portion of the transmitter device 104, are shown for clarity. In various embodiments, the receiver device 102 and transmitter device 104 are generally configured to operate according to a DVB standard, such as the DVB-T standard, the DVB-T2 standard, or the DVB-C2 standard. In other embodiments, the receiver device 102 and transmitter device 104 are generally configured to operate according to a different, suitable wireless communication standard.

In an embodiment, the IFFT and GI insertion unit 110, D/A 112, RF front-end 114 and/or antenna 116 are similar to the like-named elements of the conventional DVB system 10 described above in connection with FIG. 1. Moreover, in an embodiment, the antenna 120, RF front-end 130, A/D 132, timing recovery unit 134, and/or FFT unit 142 are similar to the like-named elements of the conventional DVB system 10 described above in connection with FIG. 1. In various embodiments, the antenna 116, and/or the antenna 120, include(s) only a single antenna, or multiple antennas. While FIG. 2 shows direct coupling between the various units in receiver device 102, and between the various units in transmitter device 104, it is understood that, in other embodiments, one or more of the units are coupled via one or more other elements (e.g., filters, amplifiers, processors, etc.) not shown in FIG. 2.

As discussed above in connection with FIG. 1, the conventional DVB system 10 converts the received signal to the baud rate before the timing error estimation unit 40 estimates a timing error associated with the signal. In the example communication system 100 of FIG. 2, however, a timing error estimation unit 136 performs integer timing error estimation at an oversampling rate that is higher than the baud rate (i.e., such that the oversampling ratio $R = T'/T_a' > 1$). In the example embodiment of FIG. 2, the A/D 132 oversamples the signal $\tilde{y}(t)$ (and outputs the signal $\hat{y}_a(n)$) at the oversampling rate. In other embodiments, the A/D 132 samples the signal $\tilde{y}(t)$ at a lower rate (e.g., at the baud rate), and the output of A/D 132 is upsampled to the oversampling rate before oversampled integer timing error estimation is performed by timing error estimation unit 136. In either case, the timing error estimation unit 136 correlates the signals, sampled at the oversampling rate, that correspond to the guard intervals of received OFDM symbols, in an embodiment. In one embodiment in which each OFDM symbol is preceded by a cyclic prefix that is the same as the end of the OFDM symbol, an autocorrelation function provides peaks that ideally correspond to the start and end of each OFDM symbol. In one such embodiment, the correlation function is calculated as $$C_a(m_a) = \frac{1}{N_a} \sum_{n_a=1}^{N_a} \hat{y}_a(n) \hat{y}_a^*(n_a + F_a + m_a), \qquad \text{Equation 6}$$

where $F_a$ is the FFT size at the oversampling rate, $n_a$ is the oversampled sample index in the OFDM symbol guard interval, $N_a$ is the total number of samples used for the correlation of the oversampled signal, and $m_a$ is the sample offset, and where $-M_a \leq m_a \leq M_a$ with $M_a$ being the maximum sample offset. In an embodiment, the constant $1/N_a$ may be omitted from Equation 6. The estimated integer timing error at the oversampling rate ($\Delta T$) is then, in some embodiments, calculated as $$\Delta T = \frac{-mm_a}{F_a + mm_a} T_a, \qquad \text{Equation 7}$$

where $T_a = T/R$ and T is the elementary time period corresponding to D/A 112 in FIG. 2, and where $mm_a$ is the value of $m_a$ for which $C_a(m_a)$ is maximized, such that $$C_a(mm_a) = \max(C_a(m_a)) \qquad \text{Equation 8}$$

Because the correlations $C_a(m_a)$ are performed on an oversampled (i.e., above baud rate) signal, the receiver device 102 exhibits, in some embodiments and/or scenarios, increased accuracy, and reduced convergence time, with respect to recovering the timing of transmitter device 104. Indeed, in some embodiments, the timing error estimation unit 136 estimates timing error based only on oversampled signals (e.g., according to Equations 6-8 above, in an embodiment). In the example embodiment shown in FIG. 2, however, the timing error estimation unit 136 additionally implements baud rate integer timing error estimation using the output of timing recovery unit 134 (e.g., according to the technique described above with respect to Equations 1-3, in an embodiment), and fractional timing error estimation using the output of FFT unit 142 (e.g., according to the technique described above with respect to Equations 4 and 5, in an embodiment). In still other embodiments, the timing error estimation unit 136 implements oversampling rate integer timing error estimation and fractional timing error estimation, but not baud rate integer timing error estimation. In some embodiments in which oversampling rate integer timing error estimation is used in conjunction with one or more of the other estimation techniques, the various estimates are combined and/or filtered (e.g., low-pass filtered) to ensure estimation robustness.

In some embodiments, one, some or all of the units of receiver device 102 shown in FIG. 2 is/are implemented in whole or in part by one or more physical processors within the receiver device 102. In one such embodiment, some or all of the one or more physical processors are hardware processors, such as integrated circuits (e.g., application specific integrated circuits (ASICs), programmable logic devices, etc.) or a collection of discrete hardware components, for example. In another embodiment, some of the physical processors are configured to read and execute software or firmware instructions stored on a tangible, non-transitory, computer-readable memory (e.g., a magnetic disk, optical disk, random access memory (RAM), read-only memory (ROM), flash memory, etc.). In some embodiments, the software or firmware instructions include machine-readable instructions that, when executed by the physical processor(s), cause the physical processor(s) to perform the actions and/or calculations described above.

Figure 3:
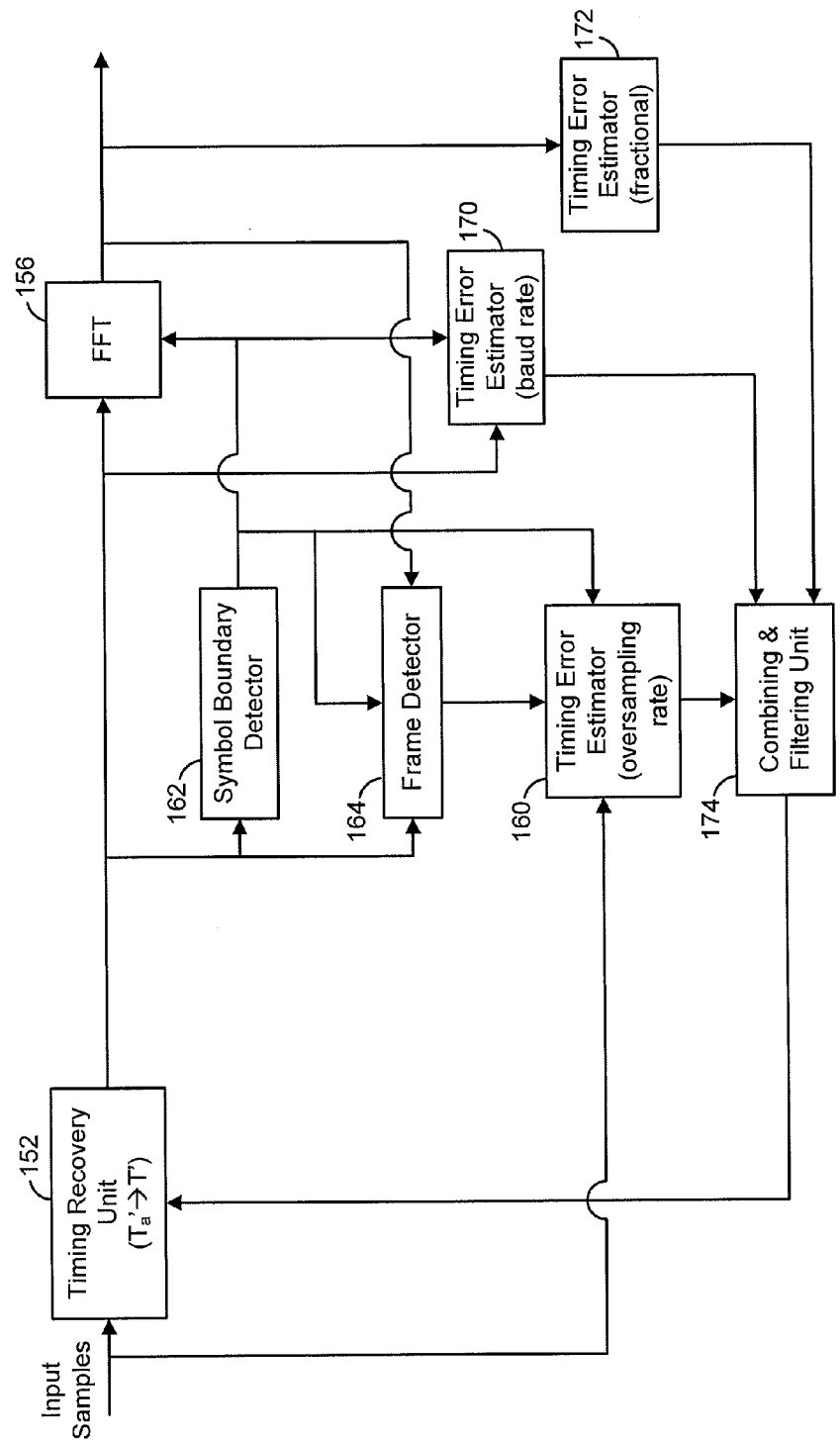
FIG. 3 is a block diagram of an example portion of a receiver device implementing modified timing error estimation techniques described herein, according to an embodiment.

FIG. 3 shows an example portion 150 of a receiver device (e.g., receiver device 102 of FIG. 2) that shows, among other elements/units, a more detailed view of a timing error estimation unit (e.g., timing error estimation unit 136 of FIG. 2), according to one embodiment. While FIG. 3 shows direct coupling between the various units in the example receiver device portion 150, it is understood that, in other embodiments, one or more of the units are coupled via one or more other elements (e.g., filters, amplifiers, processors, etc.) not shown in FIG. 3.

The example receiver device portion 150 includes a timing recovery unit 152 and an FFT unit 156, which in some embodiments are similar to timing recovery unit 134 and FFT unit 142, respectively, of FIG. 2. The example receiver device portion 150 also includes an oversampling rate timing error estimator 160 configured to perform oversampling rate (i.e., greater than baud rate) timing error estimation. The oversampling rate timing error estimator 160 receives as inputs samples corresponding to the downconverted and digitized version of the received signal (which is also provided to timing recovery unit 152), in an embodiment. In various embodiments, the oversampling rate timing error estimator 160 performs integer timing error estimation in a manner similar to that described above with respect to Equations 6-8, or in another suitable manner. One embodiment of the oversampling rate timing error estimator 160 is described in more detail below in connection with FIG. 4.

To properly align the correlation operations, the timing error estimator 160 receives information indicating the start of an OFDM symbol from a symbol boundary detector 162, in an embodiment. Further, in some embodiments, the oversampling rate timing error estimator 160 receives information indicating the start and/or end of a frame from a frame detector 164, which oversampling rate timing error estimator 160 also uses to properly align the correlation operations. In one embodiment where the receiver device portion 150 is operating in a DVB-T2 system, for example, the oversampling rate timing error estimator 160 uses the frame information to ignore, or to treat differently, irregular OFDM symbols near the end of the DVB-T2 frame, and/or to reset, and/or to push-pop operation of the oversampling rate timing error estimator 160 when a new frame is received, etc. In some embodiments, at least the frame detector 164 is omitted, and a preprogrammed interval is used instead.

The example receiver device portion 150 also includes an additional, baud rate timing error estimator 170, which is coupled to the output of the timing recovery unit 152 at a point prior to the FFT unit 156. The baud rate timing error estimator 170 receives as inputs the downsampled (baud rate) signal from the timing recovery unit 152 (which is also provided to FFT unit 156), in an embodiment. In various embodiments, the baud rate timing error estimator 170 performs baud rate, integer timing error estimation in a manner similar to that described above with respect to Equations 1-3, or in another suitable manner. In an embodiment, the baud rate timing error estimator 170 (like timing error estimator 160) also receives information indicating the start of an OFDM symbol boundary from symbol boundary detector 162.

The example receiver device portion 150 also includes a third, fractional timing error estimator 172, which is coupled to the output of the FFT unit 156. The timing error estimator 172 receives as inputs the frequency-domain signal output by the FFT unit 156, in an embodiment. In various embodiments, the fractional timing error estimator 172 performs fractional timing error estimation in a manner similar to that described above with respect to Equations 4 and 5, or in another suitable manner.

The example receiver device portion 150 also includes a combining and filtering unit 174 that is coupled to the output of the oversampling rate timing error estimator 160, the output of the baud rate timing error estimator 170, and the output of the fractional timing error estimator 172. In an embodiment, the combining and filtering unit 174 combines and/or filters (e.g., low-pass filters) the three estimator outputs to ensure estimation robustness. The combining and filtering unit 174 then provides the combined and/or filtered estimation signal to timing recovery unit 152, which processes the received signal accordingly (e.g., by adjusting the sampling frequency based on the combined and/or filtered estimation signal). In some embodiments, for example, the timing recovery unit 152 attempts to correct the timing error/offset by downsampling the oversampled input with an adjusted sampling frequency. In other embodiments, the timing recovery unit 152 instead adjusts the sampling rate at an A/D converter (e.g., similar to A/D 132 in FIG. 2), or at another suitable stage. In one embodiment, the output of the combining and filtering unit 174 is provided to the timing recovery unit 152 in a feedback manner (e.g., such that timing error information obtained based on a first OFDM symbol is used to adjust timing only for subsequent symbols). In an alternative embodiment, the output of the combining and filtering unit 174 is provided to the timing recovery unit 152 in a feedforward manner (e.g., such that timing error information obtained based on an OFDM symbol is used to adjust timing of at least that same OFDM symbol).

In some embodiments, the receiver device including receiver device portion 150 does not include the baud rate timing error estimator 170, and/or does not include the fractional timing error estimator 172. In one embodiment in which the baud rate timing error estimator 170 and the fractional timing error estimator 172 are both omitted, the combining and filtering unit 174 is also omitted and the timing error estimation calculated by oversampling rate timing error estimator 160 is provided directly to the timing recovery unit 152.

In some embodiments, one, some or all of the units shown in FIG. 3 is/are implemented in whole or in part by one or more physical processors. In one such embodiment, some or all of the one or more physical processors are hardware processors, such as integrated circuits (e.g., ASICs, programmable logic devices, etc.) or a collection of discrete hardware components, for example. In another embodiment, some of the physical processors are configured to read and execute software or firmware instructions stored on a tangible, non-transitory, computer-readable memory (e.g., a magnetic disk, optical disk, RAM, ROM, flash memory, etc.). In some embodiments, the software or firmware instructions include machine-readable instructions that, when executed by the physical processor(s), cause the physical processor(s) to perform the actions and/or calculations described above.

Figure 4:
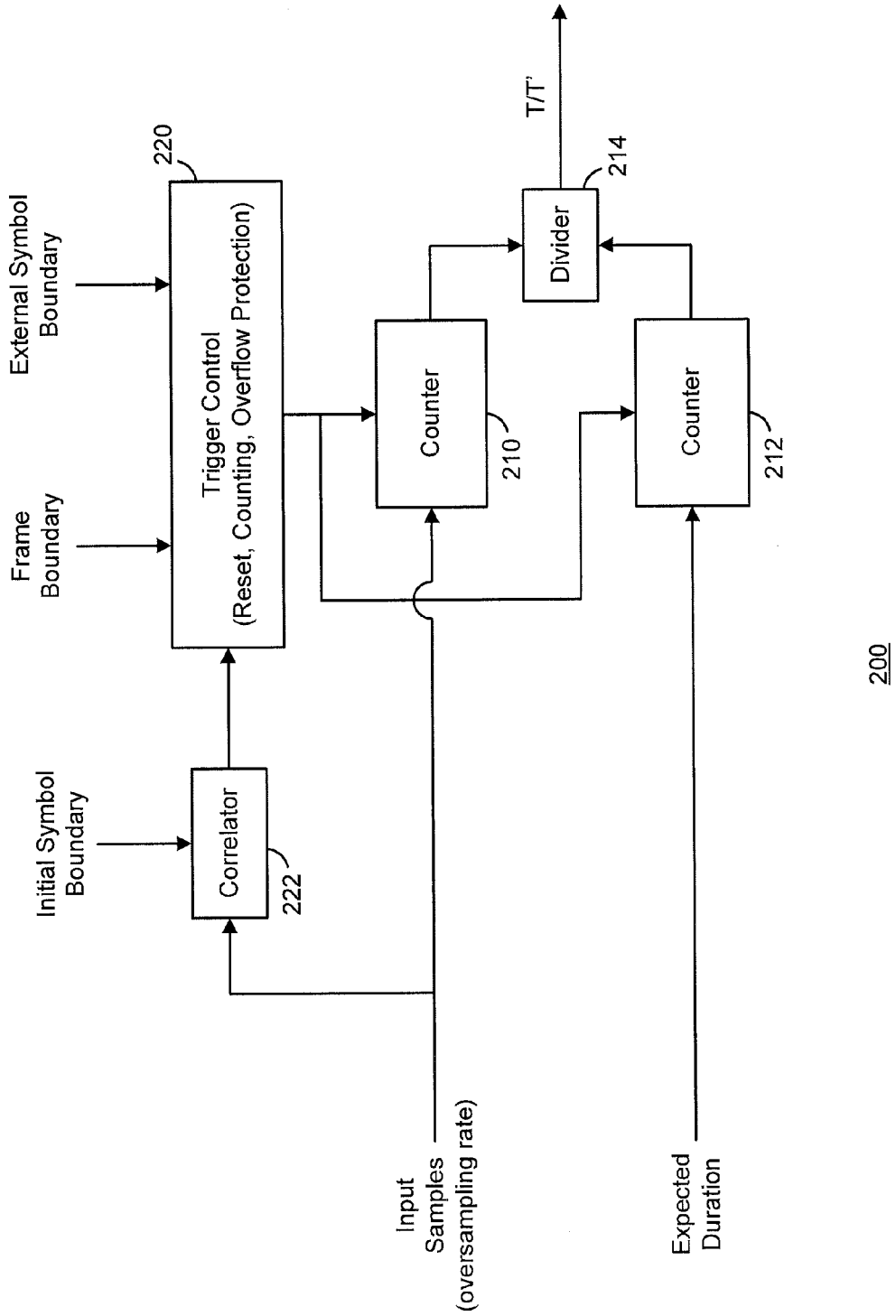
FIG. 4 is a block diagram of an example timing error estimator having reduced hardware requirements, according to an embodiment.

In one example embodiment, the oversampling rate timing error estimator 160 of FIG. 3 is configured as oversampling rate timing error estimator 200, shown in FIG. 4. While FIG. 4 shows direct coupling between the various units in the example oversampling rate timing error estimator 200, it is understood that, in other embodiments, one or more of the units are coupled via one or more other elements not shown in FIG. 4. In the oversampling rate timing error estimator 200, a first counter 210 receives a signal sampled at an oversampling rate (e.g., the signal that is also input to the timing recovery unit 152 in FIG. 2), and counts the number of samples present in the signal. The oversampling rate timing error estimator 200 also includes a second counter 212, which increments in response to a duration signal that represents an expected duration of the block (e.g., an expected number of samples at the oversampling rate). A divider unit 214 is coupled to the output of the counter 210 and the output of the counter 212, and divides the output of counter 210 by the output of counter 212 (or vice versa, in some embodiments). In this embodiment, the divider unit 214 outputs a value that represents a ratio of the actual sampling rate to the expected sampling rate. In an embodiment, this ratio approaches one as the timing error approaches zero. In an embodiment, the output of the divider unit 214 is provided to the timing recovery unit 152 (alone, or after being combined in some manner with one or more other timing error estimates such as the output of baud rate timing error estimator 170 and/or the output of fractional timing error estimator 172, for example) so that the sample rate may be adjusted. In some embodiments in which the output of the divider unit 214 is provided to a combining and filtering unit such as combining and filtering unit 174 of FIG. 3, the divider output is converted to a compatible format before the combining and filtering takes place.

To start and reset the counters 210 and 212 at the proper times (e.g., to start counting at the beginning of a received OFDM symbol), in an embodiment, a trigger control unit 220 provides various control signals to the counters 210 and 212. In an embodiment, the control signals include trigger information for starting a count and/or duration information for resetting a count, and/or count values to load into one or both of counters 210 and 212. In one embodiment, for example, the trigger control unit 220 determines the expected/desired duration (number of samples) of an OFDM symbol, or group of OFDM symbols, and loads that value into counter 212.

In some embodiments and/or scenarios, the trigger control unit 220 generates trigger information and/or duration information based on timing error information output by a correlator 222. The correlator 222 receives an indication of the initial symbol boundary from an external source (e.g., from symbol boundary detector 162 of FIG. 3, or from frame boundary detector 164 of FIG. 3, which in some embodiments includes a preamble detector as in DVB-T2), in an embodiment, and performs a correlation on the input samples at the oversampling rate to generate the timing error information. In one embodiment and/or scenario, the trigger control unit 220 uses the output of correlator 222 to determine the actual number of samples (duration) of the input signal, and directly loads a count equal to that number of samples into counter 210. In another embodiment and/or scenario, the trigger control unit 220 instead uses the output of correlator 222 to determine the appropriate trigger and duration for counting by counter 210.

In still other embodiments and/or scenarios, the trigger control unit 220 generates trigger information based on symbol boundary information, and/or frame boundary information, that is received from a source other than correlator 222 (e.g., from symbol boundary detector 162 of FIG. 3, and/or from frame boundary detector 164 of FIG. 3, which in some embodiments includes a preamble detector as in DVB-T2). As will be discussed further below, in some embodiments the trigger control unit 220 uses the output of correlator 222 to generate trigger and/or duration information, or to load a count into counter 210, for only an initial portion of a frame or session (e.g., the first OFDM symbol or symbols), and thereafter uses information from an external source (e.g., from symbol boundary detector 162 of FIG. 3, and/or from frame boundary detector 164 of FIG. 3) to generate trigger and/or duration information for the subsequent portion of the frame or session.

In some embodiments, the trigger control unit 220 controls the size/length of the "block" measured by counter 210 by controlling how many OFDM symbols of samples are accumulated before resetting counter 210. In various different embodiments and/or scenarios, for example, each block corresponds to a single OFDM symbol, to a set of two or more consecutive OFDM symbols, to a single frame, to a set of two or more consecutive frames, or to another suitable unit. By increasing the block size/length, in an embodiment, the trigger control unit 220 increases the resolution/accuracy of the timing error estimation.

In some embodiments, the oversampling rate timing error estimator 200 is implemented in hardware. In one embodiment, the correlator 222 operates on an oversampled signal with a substantially smaller sample set than an OFDM symbol guard interval, and therefore may require considerably less hardware.

Referring again to FIG. 3, it is noted that, in some embodiments and/or scenarios, the oversampling rate timing error estimator 160, the baud rate timing error estimator 170 and the fractional timing error estimator 172 do not necessarily function at the same time. In one embodiment, for example, the oversampling rate timing error estimator 160 is initially used in conjunction with fractional timing error estimator 172 (e.g., for the first one or more OFDM symbols of a frame), while the baud rate timing error estimator 170 is used in conjunction with the fractional timing error estimator 172 thereafter. In another example embodiment, only the oversampling rate timing error estimator 160 is used initially, and the baud rate timing error estimator 170 is used in conjunction with the fractional timing error estimator 172 thereafter.

In some embodiments in which multiple timing error estimation techniques are used, the operational periods of the various timing error estimators are related to hardware requirements within the receiver device. In one embodiment, for example, the oversampling rate timing error estimator 160 of FIG. 3, or the oversampling rate timing error estimator 200 (e.g., correlator 222) of FIG. 4, includes and/or utilizes post-processing hardware of the receiver device. In one such embodiment, the post-processing hardware includes memory, multipliers, and/or other suitable hardware that is/are normally used to process signals at a later stage of demodulation. In various embodiments, for example, the oversampling rate timing error estimator 160, or oversampling rate timing error estimator 200 (e.g., correlator 222), utilizes hardware, not shown in FIG. 3 or FIG. 4, that is in the receive chain after FFT unit 156 of FIG. 3, and/or utilizes hardware within FFT unit 156 itself.

In one embodiment in which the oversampling rate timing error estimator 200 of FIG. 4 is used, the correlator 222 utilizes post-processing hardware for an initial time period (e.g., the first OFDM symbol, etc.) during which the trigger control unit 220 utilizes the correlator output either to load count values into counter 210, or to set the trigger/duration for counter 210. In one such embodiment, the trigger control unit 220 also loads a count equal to the expected sample set size into counter 212, and the divider 214 generates a ratio of the outputs of the counters 210, 212 that is indicative of the timing error. After the initial time period ends, in this embodiment, the correlator 222 releases the post-processing hardware for its normal, post-processing duties. Thereafter, in an embodiment, the trigger control unit 220 instead utilizes external information (e.g., from symbol boundary detector 162 of FIG. 3, and/or from frame boundary detector 164 of FIG. 3) to generate trigger and/or duration information for the subsequent portion of the frame or session, the counters 210, 212 continuously update or accumulate, and the divider unit 214 continuously generates the ratio when needed.

Figure 5:
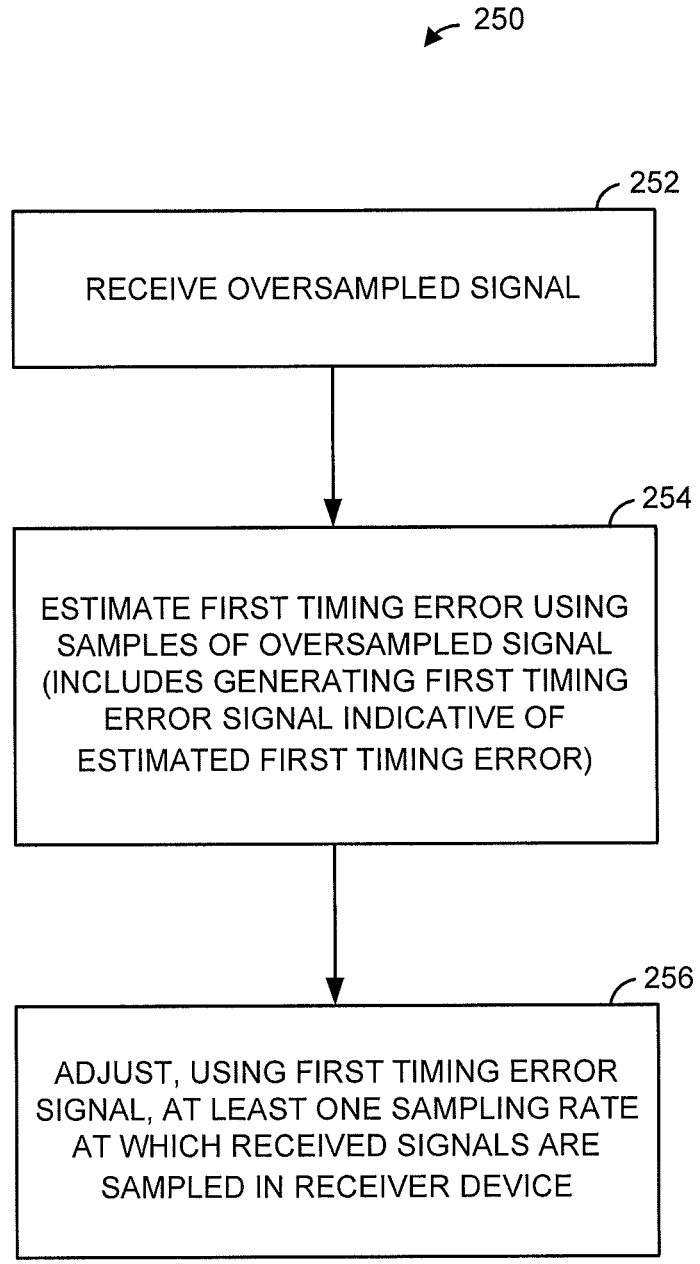
FIG. 5 is a flow diagram of an example method of performing timing recovery in a receiver device, according to an embodiment.

FIG. 5 is a flow diagram of an example method 250 of performing timing recovery in a receiver device, according to an embodiment. In an embodiment, the method 250 is implemented in a device such as receiver device 102 of FIG. 2, or a receiver device that includes the receiver device portion 150 of FIG. 3, for example.

At block 252, an oversampled signal is received. In an embodiment, block 252 is implemented by an integer timing error estimator similar to oversampling rate timing error estimator 160 of FIG. 3 or oversampling rate timing error estimator 200 of FIG. 4, for example. The oversampled signal received at block 252 corresponds to at least a first portion of an RF signal received from a transmitter device by the receiver device implementing the method 250. In one embodiment, the oversampled signal corresponds to a set of one or more OFDM symbols (e.g., one or more OFDM symbols of a DVB frame, in an embodiment). The oversampled signal received at block 252 is sampled at an oversampling rate that is higher than a baud rate of the receiver device implementing the method 250. In some embodiments, an A/D converter in the receiver device (e.g., A/D 132 of FIG. 2) samples the received RF signal directly to the oversampling rate in order to generate the oversampled signal. In other embodiments, the RF signal is converted to a digital signal at a different sampling rate by the A/D converter, and then upsampled to the oversampling rate prior to being received at block 252.

At block 254, a first timing error is estimated using samples of the oversampled signal received at block 252. In an embodiment, block 254 is implemented by a timing error estimator similar to oversampling rate timing error estimator 160 of FIG. 3 or oversampling rate timing error estimator 200 of FIG. 4, for example. In an embodiment, the first timing error is a timing error between the oversampling rate of the oversampled signal and a known/expected sampling rate. The samples used to estimate the first timing error correspond to a guard interval of a received OFDM symbol, in an embodiment, and the first timing error is estimated at least in part by correlating those samples. The estimation performed at block 254 includes generating a first timing error signal that is indicative of the estimated first timing error.

At block 256, at least one sampling rate at which received signals are sampled in the receiver device is adjusted. In an embodiment, block 256 is implemented by a timing recovery unit similar to timing recovery unit 152 of FIG. 3, for example. The sampling rate(s) is/are adjusted using the first timing error signal generated at block 254. In one embodiment, the sampling rate(s) adjusted at block 256 include a sampling rate of an A/D converter (e.g., A/D 132 of FIG. 2). Additionally or alternatively, in an embodiment, the sampling rate(s) include a sampling rate of an upsampling unit located after the A/D converter, and/or a sampling rate of a downsampling unit (e.g., a unit sampling at the baud rate) located after the A/D converter and/or after an upsampling unit. In some embodiments, the sampling rate(s) adjusted at block 256 is/are adjusted in a feedback arrangement, such that the timing error estimated for an earlier received signal is used to adjust the sample rate at which a later received signal is sampled. In other embodiments, a feedforward arrangement is used.

In some embodiments, the method 250 includes one or more additional blocks not shown in FIG. 5. In one embodiment in which the received RF signal is an OFDM signal, for example, the method 250 includes an additional block in which a second timing error is estimated using a frequency-domain signal. In one such embodiment, the frequency-domain signal corresponds to at least a second portion of the received RF signal, which in various embodiments is the same as, overlaps with, or is distinct from the first portion of the RF signal. In an embodiment, the second timing error is estimated using an output of an FFT unit similar to FFT unit 156 of FIG. 3, and the additional block is implemented by a fractional timing error estimator similar to the fractional timing error estimator 172 of FIG. 2, for example. In an embodiment, estimating the second timing error includes generating a second timing error signal indicative of the estimated second timing error. Moreover, in one such embodiment, the sampling rate(s) is/are adjusted at block 256 using not only the first timing error signal generated at block 254, but also using the second timing error signal.

In some embodiments in which the method 250 also includes a block relating to fractional timing error estimation, the method 250 includes still another block in which the timing error signal generated at block 254 and the second timing error signal are combined and filtered to generate a timing error signal. In an embodiment, this additional block is implemented by a combining and filtering unit such as the combining and filtering unit 174 of FIG. 3, for example. In one such embodiment, the sampling rate adjustment is made at block 256 using the timing error signal resulting from the combining/filtering operation, rather than (or in addition to)

using individual estimates. In one embodiment, estimating the first timing error at block 254 includes correlating samples of the first portion of the digital time-domain signal (sampled at the first sampling rate), and estimating the second timing error includes both determining a phase difference between pilots of different OFDM symbols of the frequency-domain signal, and estimating the second timing error using the determined phase difference.

In some embodiments, the method 250 further includes an additional block in which a third timing error is estimated (including the generation of a third timing error signal indicative of the estimated third timing error) using a baud rate signal (i.e., a signal sampled at the baud rate of the receiver device) that corresponds to at least a third portion of the received RF signal. In various embodiments, the third portion of the RF signal is the same as, overlaps with, or is distinct from the first and/or second portions of the RF signal. In an embodiment, the additional block is implemented by an integer timing error estimator such as the baud rate timing error estimator 170 of FIG. 3, for example. In an embodiment, the third timing error is estimated at least in part by correlating samples of the baud rate signal. In an embodiment, the sampling rate adjustment is made at block 256 using not only the first and second timing error estimation signals, but also using the third timing error estimation signal. Moreover, in one such embodiment, the method 250 includes combining and filtering of the first, second and third error estimation signals, and adjusting the sampling rate(s) at block 256 based on the resulting combined and filtered signal.

In some embodiments, the method 250 includes estimating timing errors in received signals according to different techniques at different times. In one embodiment, for example, estimation is performed according to oversampled integer timing error estimation (at block 254) during a first time period, and according to fractional timing error estimation during a second time period, where the first and second time periods are arranged in any suitable overlapping or non-overlapping manner. In another example embodiment, estimation is performed according to oversampled integer timing error estimation (at block 254) during a first time period in which better timing accuracy is desired, according to baud rate integer timing error estimation during a second time period in which timing accuracy is not critical, and according to fractional timing error estimation during a third time period, where the first, second and third time periods are arranged in any suitable overlapping or non-overlapping manner.

Figure 6:
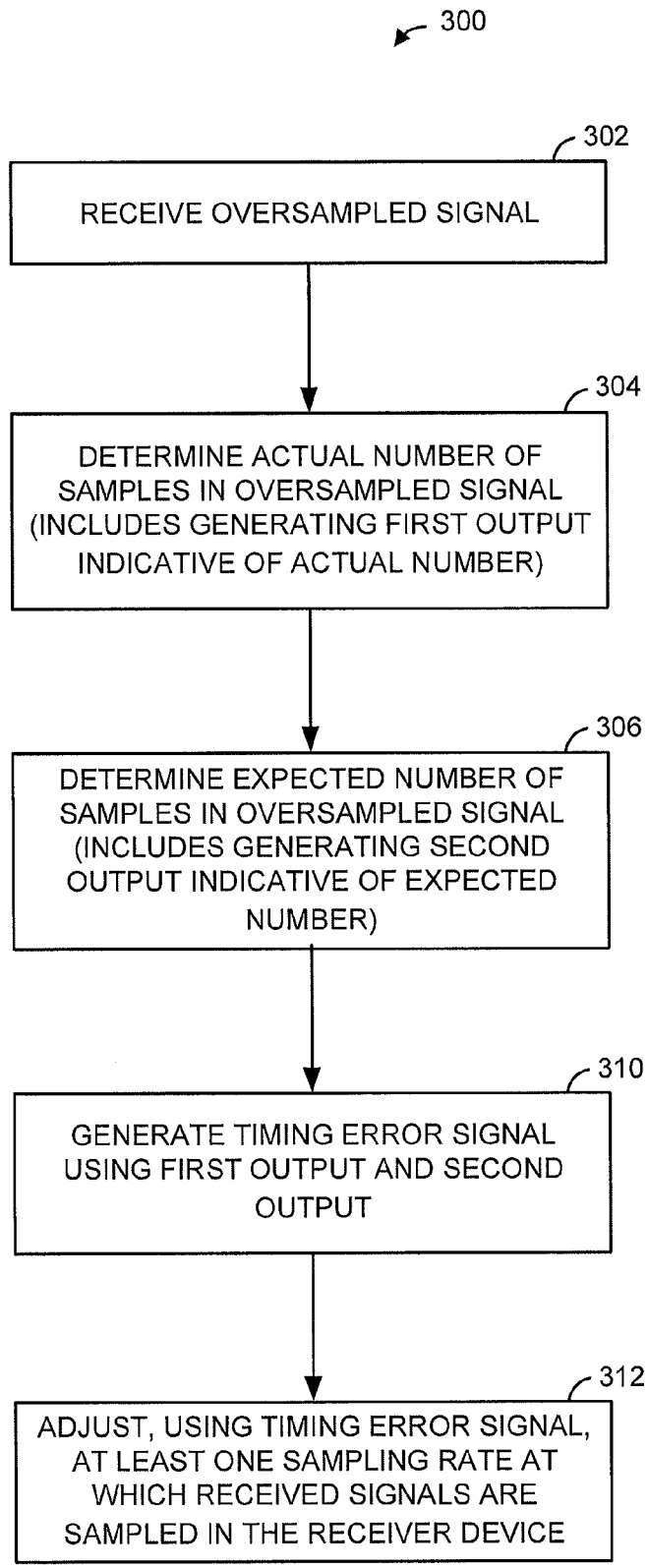
FIG. 6 is a flow diagram of another example method of performing timing recovery in a receiver device, according to an embodiment.

A more specific example of a method for performing timing recovery in a receiver device is shown in FIG. 6, according to one embodiment. The example method 300 of FIG. 6 is implemented in a device such as receiver device 102 of FIG. 2, or a receiver device that includes the receiver device portion 150 of FIG. 3, for example.

At block 302, an oversampled signal is received. In an embodiment, block 302 is implemented by a timing error estimator similar to oversampling rate timing error estimator 160 of FIG. 3 or oversampling rate timing error estimator 200 of FIG. 4, for example. The oversampled signal received at block 302 corresponds to an RF signal received from a transmitter device by a receiver device implementing the method 302. In one embodiment, the oversampled signal corresponds to a single OFDM symbol. In other embodiments, the oversampled signal corresponds to a different unit, such as a set of two or more OFDM symbols. The oversampled signal received at block 302 is sampled at an oversampling rate that is higher than a baud rate of the receiver device implementing the method 300. In some embodiments, an A/D converter in the receiver device (e.g., A/D 132 of FIG. 2) samples the received RF signal directly to the oversampling rate in order to generate the oversampled signal. In other embodiments, the RF signal is converted to a digital signal at a different sampling rate by the A/D converter, and then upsampled to the oversampling rate prior to being received at block 302.

At block 304, an actual number of samples in the oversampled signal received at block 302 (e.g., the actual number of samples in one OFDM symbol, or in a set of two or more OFDM symbols, etc.) is determined. In an embodiment, block 304 is implemented by a timing error estimator similar to oversampling rate timing error estimator 160 of FIG. 3 or oversampling rate timing error estimator 200 (e.g., counter 210) of FIG. 4, for example. Determining the actual number of samples at block 304 includes generating a first output that is indicative of the actual number. In an embodiment, the actual number of samples is determined at block 304 using a first counter to generate a first counter output that is indicative of the actual number.

At block 306, an expected number of samples in the oversampled signal received at block 302 (e.g., the expected number of samples in one OFDM symbol, or in a set of two or more OFDM symbols, etc.) is determined. In an embodiment, block 306 is implemented by a timing error estimator similar to oversampling rate timing error estimator 160 of FIG. 3 or oversampling rate timing error estimator 200 (e.g., counter 212) of FIG. 4, for example. Determining the expected number of samples at block 306 includes generating a second output that is indicative of the expected number. In one embodiment, the expected number is determined based on information in a preamble of a received RF signal (e.g., information indicating an expected duration of one or more OFDM symbols). In other embodiments, the expected number is determined in another suitable manner. In an embodiment, the expected number of samples is determined at block 306 using a second counter to generate a second counter output that is indicative of the expected number.

At block 310, a timing error signal is generated using the first output generated at block 304 and the second output generated at block 306. In an embodiment, block 310 is implemented by a timing error estimator similar to oversampling rate timing error estimator 160 of FIG. 3 or oversampling rate timing error estimator 200 (e.g., divider 214) of FIG. 4, for example. The timing error signal generated at block 310 is indicative of a timing error associated with the oversampled signal, in an embodiment. In an embodiment, the timing error signal is generated at block 310 by dividing the first output (e.g., first counter output) generated at block 304 by the second output (e.g., second counter output) generated at block 306, or vice versa, to generate a divider output.

At block 312, at least one sampling rate at which received signals are sampled in the receiver device is/are adjusted using the timing error signal (e.g., divider output) generated at block 310. In an embodiment, block 312 is implemented by a timing recovery unit similar to timing recovery unit 152 of FIG. 3, for example. Block 312 is similar to block 256 of FIG. 5, in some embodiments.

In some embodiments, the method 300 includes one or more additional blocks not shown in FIG. 5. In one embodiment, for example, the method 300 includes a first additional block in which samples in the oversampled signal are correlated to generate a correlator output, and a second additional block in which a first counter implementing block 304 and/or a second counter implementing block 306 is/are triggered based on the correlator output. In another example embodiment, the method 300 includes an additional block in which the timing error signal generated at block 310 is combined (e.g., after conversion to a suitable format) with one or more other timing error signals (e.g., a baud rate integer timing error estimate and/or a fractional timing error estimate) to generate a combined timing error signal, which is used at block 312 to adjust the sampling rate(s).

Figure 7A:
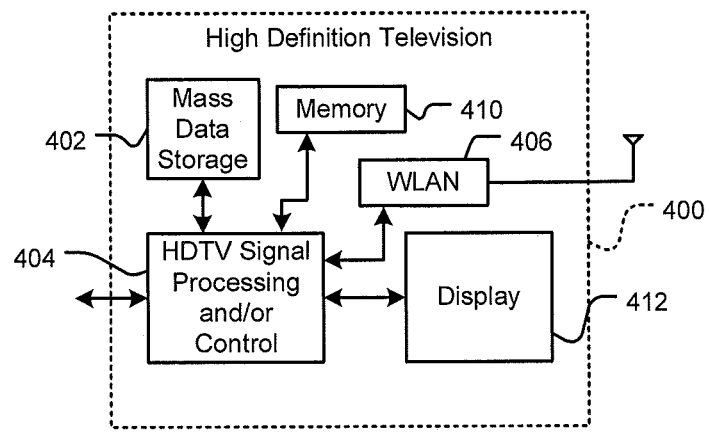
FIG. 7A is a block diagram of an example high definition television that implements timing error estimation techniques described herein, according to an embodiment.
Figure 7B:
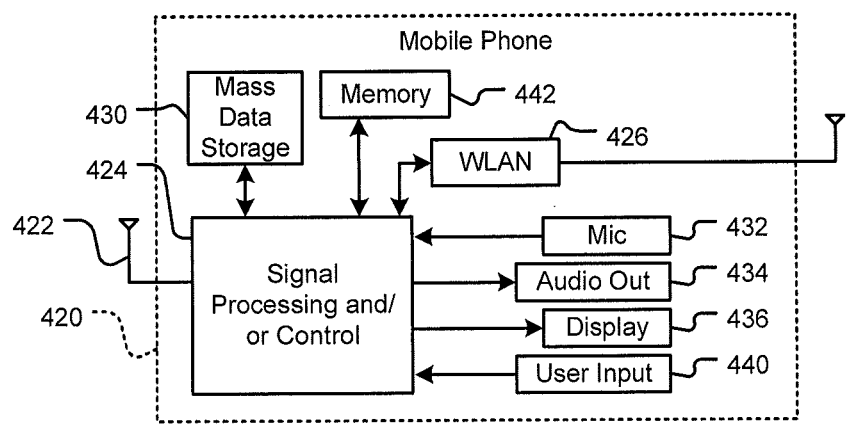
FIG. 7B is a block diagram of an example mobile phone that implements timing error estimation techniques described herein, according to an embodiment.
Figure 7C:
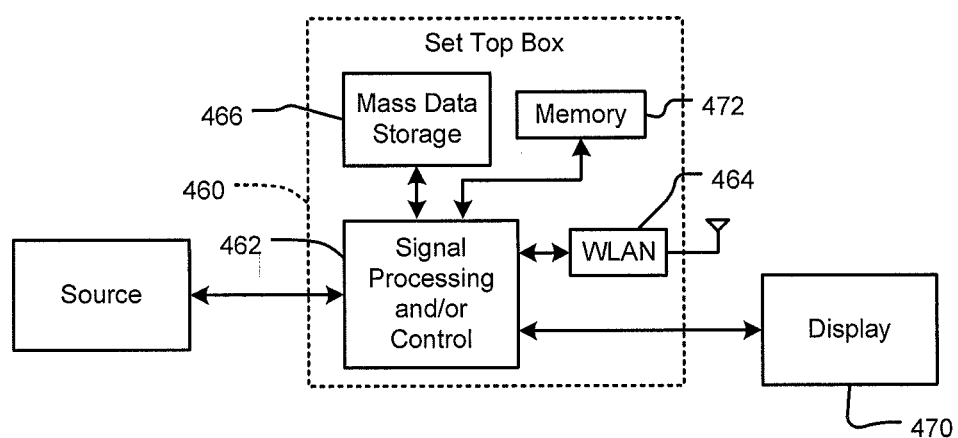
FIG. 7C is a block diagram of a set top box that implements timing error estimation techniques described herein, according to an embodiment.

Timing error estimation techniques such as those described above in connection with FIGS. 2-6 may be utilized in different types of DVB (e.g., DVB-T, DVB-T2, etc.) devices or non-DVB devices, according to various embodiments. FIGS. 7A-7C illustrate just a few examples of such devices.

Referring first to FIG. 7A, such techniques may be utilized in a high definition television (HDTV) 400. In one embodiment, the HDTV 400 is the receiver device 12 of FIG. 2. HDTV 400 includes a mass data storage 402, an HDTV signal processing and control circuit 404, a WLAN interface 406 and memory 410. HDTV 400 receives HDTV input signals in either a wired or wireless format and generates HDTV output signals for a display 412. In some implementations, signal processing circuit and/or control circuit 404 and/or other circuits (not shown) of HDTV 400 may process data, perform coding and/or encryption, perform calculations, format data and/or perform any other type of HDTV processing that may be required.

HDTV 400 may communicate with a mass data storage 402, which stores data in a nonvolatile manner. Mass data storage 402 may include optical and/or magnetic storage devices, such as hard disk drives HDD and/or DVDs. The mass storage device may be a mini HDD that includes one or more platters having a diameter that is smaller than approximately 1.8". HDTV 400 may be connected to memory 410, which may be RAM, ROM, or low latency nonvolatile memory (e.g., flash memory), and/or other suitable electronic data storage. HDTV 400 also may support connections with a WLAN via WLAN interface 406. The WLAN interface 406, and/or the signal processing and/or control circuit 404, may implement timing error estimation techniques such as those described above (e.g., some or all of the functions of timing error estimation unit 136 in FIG. 2, timing error estimators 160, 170 and/or 172 in FIG. 3, and/or timing error estimator 200 in FIG. 4, or some or all blocks of the method 250 in FIG. 5 or the method 300 in FIG. 6).

Referring now to FIG. 7B, timing error estimation techniques such as those described above may be used in a mobile phone 420 that may include an antenna 422. In one embodiment, the mobile phone 420 is the receiver device 12, or the transmitter device 14, of FIG. 2. The mobile phone 420 may include either or both signal processing and/or control circuits, which are generally identified in FIG. 7B at 424, a WLAN interface 426, and/or mass data storage 430. In some implementations, mobile phone 420 includes a microphone 432, an audio output 434 such as a speaker and/or audio output jack, a display 436 and/or an input device 440 such as a keypad, pointing device, voice actuation and/or other input device. Signal processing and/or control circuits 424 and/or other circuits (not shown) in mobile phone 420 may process data, perform coding and/or encryption, perform calculations, format data and/or perform other mobile phone functions.

Mobile phone 420 may communicate with mass data storage 430, which stores data in a nonvolatile manner. Mass data storage 430 may include optical and/or magnetic storage devices, such as hard disk drives HDD and/or DVDs. The HDD may be a mini HDD that includes one or more platters having a diameter that is smaller than approximately 1.8". Mobile phone 420 may also be connected to memory 442, which may be RAM, ROM, or low latency nonvolatile memory (e.g., flash memory), and/or other suitable electronic data storage. Mobile phone 420 also may support connections with a WLAN via WLAN interface 426. The WLAN interface 426, and/or the signal processing and/or control circuit 424, may implement timing error estimation techniques such as those described above (e.g., some or all of the functions of timing error estimation unit 136 in FIG. 2, timing error estimators 160, 170 and/or 172 in FIG. 3, and/or timing error estimator 200 in FIG. 4, or some or all blocks of the method 250 in FIG. 5 or the method 300 in FIG. 6).

Referring now to FIG. 7C, timing error estimation techniques such as those described above may be utilized in a set top box 460. The set top box 460 includes signal processing and/or control circuits, which are generally identified in FIG. 7C at 462, a WLAN interface 464, and a mass data storage 466. Set top box 460 receives signals from a source such as a broadband source and outputs standard and/or high definition audio/video signals suitable for a display 470, such as a television and/or monitor, and/or other video and/or audio output devices. Signal processing and/or control circuits 462 and/or other circuits (not shown) of the set top box 460 may process data, perform coding and/or encryption, perform calculations, format data and/or perform any other set top box function.

Set top box 460 may communicate with mass data storage 466, which stores data in a nonvolatile manner. Mass data storage 466 may include optical and/or magnetic storage devices, such as hard disk drives HDD and/or DVDs. At least one HDD may be a mini HDD that includes one or more platters having a diameter that is smaller than approximately 1.8". Set top box 460 may be connected to memory 472, which may be RAM, ROM, or low latency nonvolatile memory (e.g., flash memory), and/or other suitable electronic data storage. Set top box 460 also may support connections with a WLAN via the WLAN interface 464. The WLAN interface 464, and/or the signal processing and/or control circuit 462, may implement timing error estimation techniques such as those described above (e.g., some or all of the functions of timing error estimation unit 136 in FIG. 2, timing error estimators 160, 170 and/or 172 in FIG. 3, and/or timing error estimator 200 in FIG. 4, or some or all blocks of the method 250 in FIG. 5 or the method 300 in FIG. 6).

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any computer readable memory such as on a magnetic disk, an optical disk, or other storage medium, in a RAM or ROM or flash memory, processor, hard disk drive, optical disk drive, tape drive, etc. Likewise, the software or firmware instructions may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software or firmware instructions may be delivered to a user or a system via a communication channel such as a telephone line, a DSL line, a cable television line, a fiber optics line, a wireless communication channel, the Internet, etc. (which are viewed as being the same as or interchangeable with providing such software via a transportable storage medium). The software or firmware instructions may include machine readable instructions that, when executed by the processor, cause the processor to perform various acts.

When implemented in hardware, the hardware may comprise one or more of discrete components, an integrated circuit, an ASIC, etc.

While the present invention has been described with reference to specific examples, which are intended to be illustrative only and not to be limiting of the invention, changes, additions and/or deletions may be made to the disclosed embodiments without departing from the scope of the claims.

What is claimed is:

1. A method of performing timing recovery in a receiver device, the method comprising:
   receiving, in the receiver device, an oversampled signal corresponding to at least a first portion of a radio frequency signal received by the receiver device from a transmitter device, wherein the oversampled signal is sampled at an oversampling rate that is higher than a baud rate of the receiver device, and wherein the radio frequency signal is an orthogonal frequency division multiplexing (OFDM) signal;
   estimating, in the receiver device, a first timing error using samples of the oversampled signal, wherein estimating the first timing error includes generating a first timing error signal indicative of the estimated first timing error;
   estimating, in the receiver device, a second timing error using a frequency-domain signal, wherein
      the frequency-domain signal corresponds to at least a second portion of the radio frequency signal,
      estimating the second timing error includes generating a second timing error signal indicative of the estimated second timing error;
   combining and filtering, in the receiver device, (i) the first timing error signal, and (ii) the second timing error signal, to generate a combined and filtered timing error signal; and
   adjusting, in the receiver device and using the first combined and filtered timing error signal, at least one sampling rate at which received signals are sampled in the receiver device.

2. The method of claim 1, wherein estimating the first timing error includes correlating the samples of the oversampled signal.

3. The method of claim 1, wherein:
   estimating the first timing error includes correlating the samples of the oversampled signal; and
   estimating the second timing error includes
      determining a phase difference between pilots of different OFDM symbols of the frequency-domain signal, and
      estimating the second timing error using the phase difference.

4. A method of performing timing recovery in a receiver device, the method comprising:
   receiving, in the receiver device, an oversampled signal corresponding to at least a first portion of a radio frequency signal received by the receiver device from a transmitter device, wherein the oversampled signal is sampled at an oversampling rate that is higher than a baud rate of the receiver device, and wherein the radio frequency signal is an orthogonal frequency division multiplexing (OFDM) signal;
   estimating, in the receiver device, a first timing error using samples of the oversampled signal, wherein estimating the first timing error includes generating a first timing error signal indicative of the estimated first timing error;
   estimating, in the receiver device, a second timing error using a frequency-domain signal, wherein
      the frequency-domain signal corresponds to at least a second portion of the radio frequency signal,
      estimating the second timing error includes generating a second timing error signal indicative of the estimated second timing error;
   estimating, in the receiver device, a third timing error using a baud rate signal, wherein:
      the baud rate signal (i) is sampled at the baud rate of the receiver device and (ii) corresponds to at least a third portion of the radio frequency signal, and
      estimating the third timing error includes generating a third timing error signal indicative of the estimated third timing error; and
   adjusting, in the receiver device and using (i) the first timing error signal, (ii) the second timing error signal, and (iii) the third timing error signal, at least one sampling rate at which received signals are sampled in the receiver device.

5. The method of claim 4, the method further comprising combining and filtering, in the receiver device, (i) the first timing error signal, (ii) the second timing error signal, and (iii) the third timing error signal to generate a combined and filtered timing error signal, wherein:
   adjusting the at least one sampling rate includes adjusting the at least one sampling rate using the combined and filtered timing error signal.

6. The method of claim 4, wherein:
   estimating the first timing error includes correlating the samples of the oversampled signal;
   estimating the second timing error includes
      determining a phase difference between pilots of different OFDM symbols of the frequency-domain signal, and
      estimating the second timing error using the phase difference; and
   estimating the third timing error includes correlating samples of the baud rate signal.

7. An apparatus comprising:
   a first timing error estimator configured to
      receive an oversampled signal corresponding to at least a first portion of a radio frequency signal received by a receiver device from a transmitter device, wherein the oversampled signal is sampled at an oversampling rate that is higher than a baud rate of the receiver device and wherein the radio frequency signal is an orthogonal frequency division multiplexing (OFDM) signal, and
      estimate a first timing error using samples of the oversampled signal, wherein the first timing error estimator is configured to estimate the first timing error at least by generating a first timing error signal indicative of the estimated first timing error;
   a fast Fourier transform (FFT) unit that is
      coupled to an output of a timing recovery unit, and
      configured to generate a frequency-domain signal corresponding to at least a second portion of the radio frequency signal; and
   a second timing error estimator that is
      coupled to an output of the FFT unit, and
      configured to estimate a second timing error using the frequency-domain signal, wherein the second timing error estimator is configured to estimate the second timing error at least by generating a second timing error signal indicative of the estimated second timing error;

a combining and filtering unit that is
  coupled to (i) the output of the first timing error estimator and (ii) an output of the second timing error estimator, and
  configured to combine and filter (i) the first timing error signal, and (ii) the second timing error signal, to generate a combined and filtered timing error signal; and
the timing recovery unit that is
  coupled to an output of the first timing error estimator, and
  configured to adjust, using the combined and filtered timing error signal, at least one sampling rate at which received signals are sampled in the receiver device.

8. The apparatus of claim 7, wherein the first timing error estimator is configured to estimate the first timing error at least by correlating the samples of the oversampled signal.

9. The apparatus of claim 7, wherein:
the first timing error estimator is configured to estimate the first timing error at least by correlating the samples of the oversampled signal; and
the second timing error estimator is configured to estimate the second timing error at least by
  determining a phase difference between pilots of different OFDM symbols of the frequency-domain signal, and
  estimating the second timing error using the phase difference.

* * * * *